INSULATED-GATE FIELD EFFECT TRANSISTORS UTILIZING
A HIGH RESISTIVITY SUBSTRATE
Filed Aug. 31, 1967

INVENTOR.
PAUL RICHMAN
WALTER ZLOCZOWER
BY Joseph H. Rediger
ATTORNEY.

3,493,824

INSULATED-GATE FIELD EFFECT TRANSISTORS UTILIZING A HIGH RESISTIVITY SUBSTRATE

Paul Richman, Bayside, and Walter Zloczower, Glen Cove, N.Y., assignors to General Telephone & Electronics Laboratories Incorporated, a corporation of Delaware

Filed Aug. 31, 1967, Ser. No. 664,848

Int. Cl. H01l *11/00, 15/00, 3/00*

U.S. Cl. 317—235 7 Claims

ABSTRACT OF THE DISCLOSURE

An MOS insulated-gate field effect transistor is described in which the drain and source regions formed in the semiconductor substrate have the same conductivity type as the substrate and a surface accumulation layer, rather than a surface inversion layer, is utilized as the conducting channel between the source and drain regions. The substrate is a high resistivity semiconductor material in order to limit leakage current through the substrate. Combining this transistor with a field effect transistor having an opposite conductivity type conducting channel enables complementary MOS pairs to be formed on a bulk substrate by standard planar integrated circuit fabrication techniques.

BACKGROUND OF THE INVENTION

This invention relates to insulated-gate field effect transistors and, more particularly, to a complementary pair of MOS field effect transistors formed on a semiconductor substrate.

The metal-oxide-semiconductor (MOS) transistor is especially suited for use in digital integrated circuits because of its ability to be switched from a high-impedance "off" state to a low-impedance "on" state. The theory and operation of this type of transistor are described in an article entitled "The Silicon Insulated Gate Field-Effect Transistor" by F. P. Heiman and S. R. Hofstein appearing in the September 1963 Proceedings of the IEEE. The realization of the full potential for the field effect transistor depends on the ability of these devices to be formed in the silicon substrates conventionally utilized in the fabrication of integrated circuits. To this end, considerable effort has been expended in the formation of both N and P channel devices in silicon substrates.

One of the more promising applications of this type of device lies in the fabrication of low power digital memory systems using complementary MOS transistors. Complementary digital systems are known to require very low standby power for their operation. To obtain a digital system of this type, it is necessary that both N and P channel enhancement field effect devices be fabricated on the same substrate. Accordingly, several approaches to this problem have been reported. One such approach utilizes a substrate counterdoping technique wherein a major portion of the substrate is doped to the opposite conductivity type. The P and N channel devices are then formed on the opposite conductivity portions of the substrate. An alternative approach utilizes epitaxial refill of the substrate with opposite conductivity type material and the subsequent grinding and polishing of the substrate surface to provide a substrate containing regions of both N and P type having a resistivity within the approximate range of 1 to 10 ohm-cm. in a silicon substrate.

These techniques require additional steps to be performed on the substrate prior to device fabrication. In practice, it has been found difficult to reproducibly provide uniform counter-doped or refilled N and P regions at these low doping densities in a single silicon substrate. However, the reliance of the insulated-gate field effect transistor on a PN junction formed at the drain-substrate and source-substrate regions has heretofore required that the substrate have different conductivity type regions for the N-channel and the P-channel devices.

SUMMARY OF THE INVENTION

The insulated-gate field effect transistors constructed in accordance with the present invention permit both N-channel and P-channel devices to be formed in a bulk substrate of a single conductivity type. In other words, it is now possible to form complementary pairs of these transistors on a single bulk substrate which has not been counter-doped or refilled to contain separate impurity regions.

The present device utilizes a high resistivity substrate of a single conductivity type as the common substrate for both N-channel and P-channel units. By high resistivity material, it is meant that, for a silicon substrate, the resistivity is at least 10,000 ohm-cm. While both N-type and P-type substrates may be employed, the following brief description refers to a high resistivity P-type or $\pi$ substrate.

The P-channel field effect transistor utilizing a $\pi$ substrate comprises first and second $P^+$ regions of high P type conductivity formed at the surface of the $\pi$ substrate. These regions are acceptor doped as is the substrate and are referred to herein as the drain and source regions respectively. First and second electrodes, termed herein the drain and source electrodes respectively, are formed on the corresponding regions.

The high conductivity source and drain regions formed in the substrate have a separation therebetween. Means for modulating the conductivity between the two regions is provided on the surface of the substrate in the separation between the regions. The modulating means generally includes an insulating layer formed on the substrate surface directly over the separation and an overlying gate electrode formed on the insulating layer.

The application of a negative voltage to the gate electrode attracts majority carrier holes from the $\pi$ substrate to the surface thereof. This results in the formation of an accumulation layer at the substrate surface. The accumulation layer constitutes the conducting channel. Normally, a P-channel device is formed in an N-type substrate and relies on the production of an inversion layer by attracting minority carriers from the substrate. The use of an N-type substrate provides an efficient turn-off mechanism due to the fact that in the absence of a gate voltage, a back-biased PN junction forms near the drain electrode. Since the $\pi$ substrate in the present device possesses the same conductivity type as the source and drain regions, the conventional PN junction is not obtained.

Instead, the high resistivity of the substrate results in the formation of $P^+$ $\pi$ interfaces at the drain-substrate and source-substrate boundaries. These interfaces are found to exhibit rectifying properties similar to those of a PN junction. As a result, reverse leakage currents are essentially eliminated when the device is in its off or nonconductive state. Thus, it is the $P^+$ $\pi$ interface rather than the resistance of the path through the bulk of the substrate that permits the device to exhibit very small leakage currents, of the order of nanoamperes, when it is turned off. In addition, the high resistivity of the substrate prevents a low impedance conducting path from shunting the accumulation layer when the transistor is rendered conductive.

The afore-described P-channel enhancement transistor is fabricated on a $\pi$ substrate and its complement, an enhancement N-channel transistor, can be readily provided on the same substrate without resorting to the establishment of separate regions of both N- and P-type conductivity therein. The N-channel device utilizes a reverse-biased PN junction for the establishment of the off state since the $\pi$ substrate is P-type and the source and drain regions are N-type. However, surface leakage currents may occur in the N-channel device due to the formation of an initial N-channel with zero gate voltage at the substrate surface by positive charge contained or "trapped" in the insulating layer. This surface inversion layer can be compensated for in the fabrication of the N-channel device by a slight N-doping of the insulating layer or a P-doping of the channel. In addition, an insulating layer or combination of insulating layers which yields a surface concentration of electrons at zero gate voltage that is equal to or less than the majority carrier concentration in the substrate or the concentration of electron surface traps in the substrate may be utilized to substantially eliminate the inversion layer. The particular insulating layer or combination thereof employed in the latter case is determined by the surface potential of the substrate required for the absence of an inversion layer at zero gate voltage and the number of surface trapping states.

The fabrication of the P-channel enhancement transistor on a $\pi$ substrate enables complementary pairs of field effect transistors to be constructed on the substrate without requiring the use of counter-doped opposite conductivity regions therein. As a result, a reduction in the number of processing steps is obtained and the packing density of the devices is increased. Also, the high resistivity of the substrate insures that the drain-source breakdown voltages for both the N and P channel units are high. Further, the threshold voltages of both P- and N-type transistors constructed in accordance with the invention are relatively low.

Further features and advantages of the invention will become more readily apparent from the following detailed description of the invention when taken in conjunction with the accompanying drawings.

DESCRIPTION OF THE PREFERRED EMBODIMENT

Figure 1:
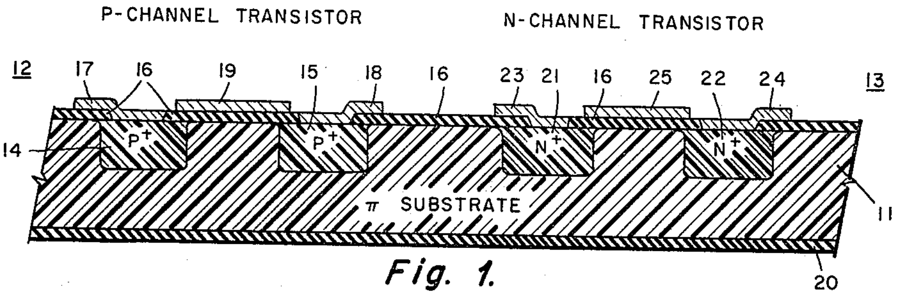
FIG. 1 is a side-view in section of one embodiment of the invention.

Referring now to FIG. 1, a complementary pair of insulated-gate field effect transistors is shown fabricated on a high resistivity semiconductor substrate 11 of single conductivity type. The substrate is comprised of high-resistivity P-type material and is designated herein as $\pi$ material. However, high resistivity N-type or $\nu$ material may be utilized if desired.

The P-channel device 12 comprises first and second spaced regions 14 and 15 formed, for example by diffusion, in one surface of substrate 11. These regions are heavily doped with acceptor impurities so as to be highly conductive. For this reason, regions 14 and 15 are designated as $P^+$ material. In addition, insulating layer 16 is formed on the surface of the substrate and overlies the separation between the regions 14 and 15. An electrode 17, 18 is provided for each of the regions 14, 15 and a gate electrode 19 is formed on the portion of insulating layer 16 overlying the separation between the regions 14 and 15. As shown, electrodes 17 and 18 are interchangeable and, for purposes of this description, are referred to herein as the source and drain electrodes respectively.

In operation, the P-channel transistor 12 is turned on when a negative voltage is applied to gate electrode 19. The negative voltage establishes an electric field in the adjacent portion of insulating layer 16 which results in the attraction of majority carrier holes from the bulk of substrate 11 to the interface between the layer and the substrate. This produces a surface accumulation layer which forms a conducting channel between the $P^+$ regions 14 and 15 underlying the source and drain electrodes. In normal circuit operation, the source electrode in a P-channel field effect transistor corresponds to the electrode with the highest positive voltage. Thus, the coupling of electrode 17 to ground and the application of a negative voltage to the drain electrode 18 results in the flow of current through the induced conducting channel when the voltage applied to gate electrode 19 is negative.

Figures 2, 3:
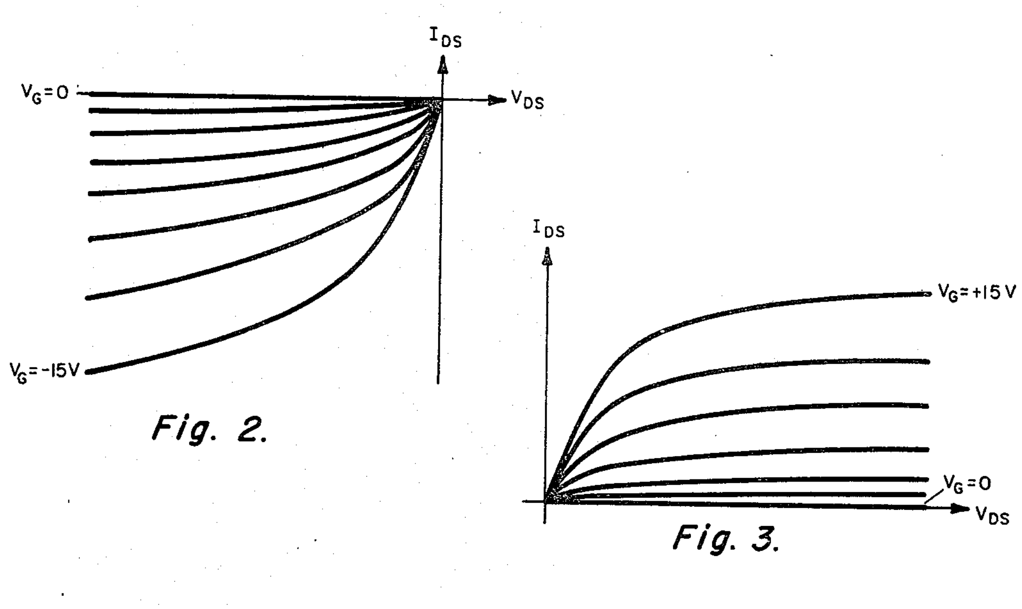
FIG. 2 is a series of curves showing the operating characteristics of the P-channel transistor of the embodiment of FIG. 1.
FIG. 3 is a series of curves showing the operating characteristics of the N-channel transistor of the embodiment of FIG. 1.

The current-voltage operating characteristics for the P-channel transistor 12 of FIG. 1 are shown in FIG. 2. The curves are similar to those of a vacuum tube pentode and are taken over a range of drain-source voltages $V_{DS}$ of 0 to −40 volts and drain-source currents $I_{DS}$ of 0 to −8 milliamperes. The gate voltage $V_G$ was varied from 0 to −15 volts. In a particular embodiment employing a silicon substrate having a resistivity of 34,000 ohm-cm. and an $SiO_2$ insulating layer having a thickness of about 2,000 angstroms, the drain-to-source leakage currents at zero gate voltage were found to be 12 nanoamperes at $V_{DS}=-40$ volts. The average transconductance at gate voltages $V_G$ of about −15 volts was found to be 2,000 $\mu$mhos. The threshold voltage for this transistor is approximately −3 volts.

Due to the lack of a conventional PN junction at the drain-substrate and source-substrate boundaries, the drain-to-source breakdown voltages of the present field effect transistor 12 were found to be relatively high. The units tested exhibited saturation regions extending to $V_{DS}=-65$ volts before the onset of avalanche breakdown. Because of the relatively low electric field strength present at the boundary of a $P^+ \pi$ junction, the drain-to-source breakdown is attributed to electric field intensification in the channel region directly below where the gate electrode 19 overlaps the drain region 15. The breakdown occurred through the channel and not through the bulk of the $\pi$ substrate. To minimize the interelectrode capacitance and increase the breakdown voltage of the transistor, substantial overlapping of the drain and source regions by the gate electrode should be prevented.

Figure 4:
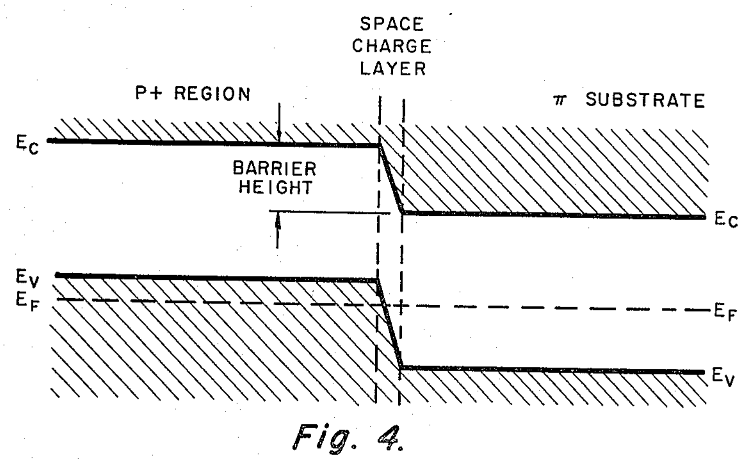
FIG. 4 is an energy level diagram of the $P^+ \pi$ interface of the embodiment of FIG. 1.

The energy level diagram of the $P^+ \pi$ interface is shown in FIG. 4. The rectifying characteristic exhibited by this interface is due to the existence of a potential barrier therebetween.

The height of the barrier controls the leakage current in the device when it is turned off and is determined primarily by the resistivity of the $\pi$ substrate and the carrier concentration of the $P^+$ region.

The resistivity of the substrate is required to be high so that the Fermi level $E_F$ is near the center of the substrate band gap. When the resistivity of the substrate is increased the Fermi level moves toward the center of the band gap. In the case of silicon, the resistivity of the substrate is required to be at least as high as 10,000 ohm-cm., and in the preferred embodiments is about 34,000 ohm-cm. The Fermi level is set by the substrate.

The carrier concentration of the $P^+$ region determines the location of its valence band and conduction band energy levels $E\nu$ and $Ec$ with respect to the Fermi level $F_F$. At equilibrium, the Fermi level remains constant throughout the semiconductor and is therefore shown as a level straight line in FIG. 4. The carrier concentration of the $P^+$ region is required to be relatively high in the present device and, in preferred embodiments, the regions are doped to degeneracy. This condition is shown in FIG.

4 wherein the valence band energy level $E_V$ is above the Fermi level $E_F$. For the case of a silicon substrate, the carrier concentration is chosen to be about $10^{21}$ carriers per cm.$^3$. This insures that the barrier height is sufficient to prevent the flow of significant leakage currents between the source and drain regions. Although difficult to fabricate, it was found possible to obtain low leakage currents in devices having P+ regions with carrier concentrations as low as $10^{18}$ carriers per cm.$^3$. However, it shall be noted from FIG. 4, that as the carrier concentration of the P+ regions is decreased from the level of degeneracy, the energy levels Ec and Ev move downward and thereby decrease the barrier height.

When the device is turned off, i.e. the gate voltage is zero, significant conduction between source and drain in the channel region is prevented by the rectifying properties of the P+ $\pi$ interfaces. If an N-inversion layer is present at the surface, it is accompanied by the formation of an adjacent depletion layer in which the acceptors are ionized. The presence of the inversion and depletion layers increases the threshold gate voltage of the P-channel transistor required to establish an accumulation layer. The inversion layer occurs primarily because of the presence of positive trapped charge in the insulating layer and can be eliminated as later explained.

The structure of the complementary N-channel field effect transistor 13 is shown in FIG. 1. The device is frabricated on $\pi$ substrate 11 and comprises third and fourth regions 21 and 22 of N-type conductivity. These regions are shown in FIG. 1 as N+ regions indicating that they are of high conductivity. These regions may be formed by the diffusion of phosphorous in the silicon substrate. Insulating layer 16 overlies the separation between these regions. An electrode 23, 24 is provided for each of the regions 21, 22 respectively and a gate electrode 25 is formed on the portion of layer 16 overlying the separation between the regions. Electrodes 23 and 24 are interchangeable and are referred to herein as the source and drain electrodes respectively.

In operation, the N-channel transistor 13 is turned on when a positive voltage is applied to gate electrode 25 and the drain to source voltage $V_{DS}$ is positive. The electric field established by the gate voltage attracts electrons to the interface between the insulating layer 16 and substrate 11. This induces an N-type conducting channel between regions 21 and 22. When the applied gate voltage is zero, the transistor 13 is in its off state since no inversion layer is induced and the conducting channel reverts to P-type conductivity. As a result, a PN junction should form near the region 22 underlying drain electrode 24 at zero gate voltage. However, an N-type inversion layer may form in the channel due to the aforementioned positive charge "trapped" in the insulating layer 16. The effect of this N-type inversion layer on the operation of N-channel transistor 13 is to cause reverse leakage currents to flow between the source and drain.

The N-type inversion layer in both P- and N-channel transistors can be eliminated by several different methods. One such method comprises exposing the portion of insulating layer 16 overlying the separation between drain and source of both devices to a light doping of donor impurity, such as phosphorous, prior to the evaporation of the gate electrodes, 19 and 25. An alternative is to provide a light acceptor impurity, for example boron, doping the portion of the surface of substrate 11 between regions 21 and 22. This technique is applicable for the N channel device only. A third alternative is to use a suitable insulator 16 (or combination of layered insulators) to the total work function of which is greater than the work function of the substrate so as to eliminate any N-inversion layer. Also, the use of a metal having a work function higher than the substrate for the electrodes 19 and 25 has been found to eliminate any N inversion layer.

The operating characteristics of N-channel transistor 13 of FIG. 1 are shown in FIG. 3. The N+ regions were formed by the diffusion of phosphorus in silicon substrate 11. In the embodiment tested and operated, the portion of the surface of substrate 11 between these regions was given a shallow low temperature low density boron doping to counteract the effect on any initial N-type inversion channel which might be formed by the overlying insulating layer.

As shown in FIG. 3, the drain-source current $I_{DS}$ versus drain-source voltage $V_{DS}$ characteristics of N-channel transistor 25 are complementary to the characteristics of P-channel transistor 12. The dynamic range shown is for $V_{DS}$ varied from 0 to 20 volts and for $I_{DS}$ varied from 0 to 5 milliamperes. The gate voltage $V_G$ is shown varied from 0 to about +15 volts. The leakage current at zero gate voltage was found to be about one microampere.

By employing a high resistivity substrate, the present invention provides a pair of complementary field effect transistors in a single conductivity type substrate without requiring the extensive counterdoping of the substrate heretofore employed. The resistivity of the substrate is required to be high, at least 10,000 ohm-cm. for silicon, in order to provide the low leakage currents for P-channel unit 12. In practice, it is preferable to employ substrates having a resistivity of 34,000 ohm-cm. or greater. Although the description has referred to the formation of N and P-channel transistors on a high resistivity P-type substrate, similar results are obtained for the fabrication of P and N-channel transistors on a high resistivity N-type substrate. Again, the N-type layer due to the insulating layer is compensated for in the N-channel transistor to minimize leakage currents. The planar geometry of the elements, whether open or closed, is determined by the masks employed during fabrication. While the foregoing description has referred to a specific embodiment of the invention, it will be apparent that many variations and modifications may be made therein without departing from the spirit and scope of the invention.

What is claimed is:

1. A field effect device comprising:

(a) a layer of semiconductor material of a single conductivity type, said layer having a resistivity of at least 10,000 ohm-cm.;

(b) first and second regions of high conductivity material formed in said layer, said regions having the same conductivity type as said layer, said regions having a separation therebetween;

(c) first and second electrodes formed on said first and second regions respectively; and (d) first means for modulating the surface conductivity of said layer, said first means being formed on the surface of said layer in the separation between said regions.

2. The field effect device in accordance with claim 1 in which said first and second regions have a carrier concentration of at least $10^{18}$ carriers per cm.$^3$.

3. The field effect device in accordance with claim 2 in which said means for modulating the surface conductivity of said layer comprises (a) an insulating layer formed on said layer of high resistivity semiconductor material in the separation between said regions, and (b) a gate electrode formed on said insulating layer.

4. The field effect device in accordance with claim 2 in which said layer of high resistivity semiconductive material is formed of silicon.

5. The field effect device in accordance with claim 4 in which said silicon layer has a resistivity of at least 34,000 ohm-cm.

6. The field effect device in accordance with claim 1 further comprising (a) third and fourth regions of high conductivity formed in said layer, said regions having a conductivity type opposite to that of said layer, said regions having a separation therebetween;

(b) third and fourth electrodes formed on said third and fourth regions respectively, and (c) second means for modulating the surface conductivity of said layer, said second means being formed on the surface of said layer in the separation between said first and second regions.

7. The field effect device in accordance with claim 6 in which said substrate has a resistivity of at least 34,000 ohm-cm.

References Cited

UNITED STATES PATENTS

| | | | |
|---|---|---|---|
| 3,340,598 | 9/1967 | Hatcher | 29—571 |
| 3,386,016 | 5/1968 | Lindmayer | 317—235 |

JOHN W. HUCKERT, Primary Examiner

B. ESTRIN, Assistant Examiner

U.S. Cl. X.R.

317—234